US011830547B2

(12) United States Patent
Liu et al.

(10) Patent No.: US 11,830,547 B2
(45) Date of Patent: Nov. 28, 2023

(54) REDUCED INSTRUCTION SET PROCESSOR BASED ON MEMRISTOR

(71) Applicant: HUAZHONG UNIVERSITY OF SCIENCE AND TECHNOLOGY, Hubei (CN)

(72) Inventors: Qun Liu, Hubei (CN); Yewang Wang, Hubei (CN); Xiangshui Miao, Hubei (CN); Jian Li, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 628 days.

(21) Appl. No.: 17/054,529

(22) PCT Filed: Nov. 29, 2018

(86) PCT No.: PCT/CN2018/118085
§ 371 (c)(1),
(2) Date: Nov. 11, 2020

(87) PCT Pub. No.: WO2020/087619
PCT Pub. Date: May 7, 2020

(65) Prior Publication Data
US 2021/0117189 A1    Apr. 22, 2021

(30) Foreign Application Priority Data

Oct. 29, 2018 (CN) .......................... 201811268340.7

(51) Int. Cl.
*G11C 13/00* (2006.01)
(52) U.S. Cl.
CPC ...... *G11C 13/0007* (2013.01); *G11C 13/0026* (2013.01); *G11C 13/0028* (2013.01); *G11C 13/0038* (2013.01)

(58) Field of Classification Search
CPC ............ G11C 13/0007; G11C 13/0026; G11C 13/0028; G11C 13/0038
See application file for complete search history.

(56) References Cited

U.S. PATENT DOCUMENTS 10,020,054 B2 * 7/2018 Liu .................... G11C 13/0097
10,318,242 B2 * 6/2019 Swartzlander .......... G06F 7/501
(Continued)

FOREIGN PATENT DOCUMENTS

| CN | 104898990 | 9/2015 |
|---|---|---|
| CN | 108197705 | 6/2018 |
| CN | 108228642 | 6/2018 |

OTHER PUBLICATIONS

"International Search Report (Form PCT/ISA/210) of PCT/CN2018/118085", dated Jul. 26, 2019, with English translation thereof, pp. 1-4.

*Primary Examiner* — Kurtis R Bahr
(74) *Attorney, Agent, or Firm* — JCIPRNET

(57) ABSTRACT

A reduced instruction set processor based on a memristor is provided. The memristor is a non-volatile device using a resistor to store "0" and "1" logic while implementing "implication logic" through applying a pair of voltages $V_{COND}/V_{SET}$. Various data operations, logic operations, and arithmetic operations may be implemented based on the implication logic. The memristor is a computation and memory fusion device having great potential. A computer processor based on the memristor also becomes the research direction of the next-generation computer processor. The computer processor based on a memristor is designed according to the memory and computation fusion characteristic of the memristor. The processor is different from a traditional computer that must use a special memory and a calculator, and fuses computation and memory. Compared with a traditional computer, the speed, parallelism degree, (Continued)

and power consumption of the computer processor based on the memristor are greatly improved.

9 Claims, 4 Drawing Sheets

(56) References Cited

U.S. PATENT DOCUMENTS

| | | |
|---|---|---|
| 2012/0109866 A1 | 5/2012 | Modha |
| 2019/0237137 A1* | 8/2019 | Buchanan .......... G11C 13/0007 |

* cited by examiner

R type :

| 31 30 29 | 25 24 | 20 19 | 15 14 | 10 9 | 5 4 | 0 |
|---|---|---|---|---|---|---|
| 00 | opcode | rd | rs1 | rs2 | 0 | #shamt |

I type :

| 31 30 29 | 25 24 | 20 19 | 15 14 | 5 4 | 0 |
|---|---|---|---|---|---|
| 00 | opcode | rd | rs | #imm | #shamt |

J type :

| 31 30 29 | 25 24 | 15 14 | 0 |
|---|---|---|---|
| 01 | opcode | #label | 0 | illegal instruction :

| 31 30 | 0 |
|---|---|
| 11 | not defined |

REDUCED INSTRUCTION SET PROCESSOR BASED ON MEMRISTOR

CROSS-REFERENCE TO RELATED APPLICATION

This application is a 371 of international application of PCT application serial no. PCT/CN2018/118085, filed on Nov. 29, 2018, which claims the priority benefit of China application no. 201811268340.7, filed on Oct. 29, 2018. The entirety of each of the above mentioned patent applications is hereby incorporated by reference herein and made a part of this specification.

BACKGROUND

Technical Field

The disclosure relates to the field of computer processors, and particularly relates to a reduced instruction set processor based on a memristor.

Description of Related Art

All modern computers follow the design principle of the von Neumann architecture. In such architecture, the computing and memory modules are separated and are connected via a bus. When the computer is running, instructions and data are continuously transported between the processor and the memory through the bus. However, when the computer is running, the spending used in moving the data between the processor and the memory system is far greater than the spending for the actual computation of the processor. Such spending includes power consumption, time, space, etc. Such frequent and costly data movement is considered as the "von Neumann bottleneck". As long as the computer still adopts the von Neumann architecture, the von Neumann bottleneck will always exist. It is foreseeable that as time goes by, the von Neumann bottleneck will inevitably become the biggest obstacle limiting the performance of the computer.

We hope to solve such issue through fundamentally changing the architecture of the computer. A computer processor based on a memristor may be the next-generation computer processor for computation and memory fusion with great potential. The memristor is a non-linear resistor with memory function, and the resistance value thereof may be changed through controlling the current change. If the high-impedance state is recorded as a logic "0" and the low-impedance state is recorded as a logic "1", then such resistor that changes with the current may be used as a memory device to save data. Compared with the traditional volatile level logic that expresses "0" and "1" with high and low voltages, the memristor saves the logics "0" and "1" according to the resistance state thereof, and information thereof is still saved after power off, so the memristor is a non-volatile memory device.

In 2010, Borghett et al. of HP Laboratories proposed an implication logic based on a memristor, which is to respectively apply a pair of voltage pulses $V_{COND}/V_{SET}$ to a pair of memristors, so as to implement an operation referred to as the "implication logic". Based on the implication logic and clear operation, all 16 types of Boolean logic operations may be implemented. Such implication logic is implemented through directly applying voltage to the original position, and the operation result is also stored in the original position. Due to the computation and memory fusion characteristic of the implication logic, the spending for a large amount of data movement in the computer based on a memristor may be saved. Therefore, the von Neumann bottleneck does not exist in the computer based on a memristor.

In summary, the memristor has unique advantages in terms of memory and computation. Therefore, the computer processor based on a memristor may be a research path to new computer processors. At present, the research on memristors mostly focuses on what type of materials and processes to be used for the memristors to have relatively stable resistance and not be affected by the voltage applied to adjacent units; and how to use the memristors to implement the Boolean logic and arithmetic operations more efficiently through the implicit operation. However, the research on the construction of memristive computer system architecture, including the architecture of memristive computer, the scheduling and allocation of computing resources, the control of parallel computation, the microinstruction set, etc., is still relatively in the initial stage.

SUMMARY

In view of the defects of the prior art, the objective of the disclosure is to provide a reduced instruction set processor based on a memristor, which aims to solve the issues of power consumption and time spending caused by frequent data movement between the memory and the processor of modern computers.

The disclosure provides a reduced instruction set processor based on a memristor, which includes a computing and memory chip based on a memristor. The computing and memory chip includes N computing and memory units. Each computing and memory unit serves as a row of the chip and corresponds to an on-chip address. Each computing and memory unit includes M memristive units, marking units, and connection switches. Each memristive unit includes a bit line switch and a memristor connected in series. Any two of the N computing and memory units may be connected through the connection switch located on a word line. The M memristive units, marking units, and connection switches in each row are connected in series through the word line. One end of the word line is configured to connect a row selection module, and the other end is configured to connect a voltage supply module. The memristive units representing the same bit in all the computing and memory units are connected in series through a bit line. One end of the bit line is grounded, and the other end is configured to connect a column selection module. M is a positive integer greater than or equal to 8 and is usually a multiple of 8. The value of N is set according to actual requirements.

The N computing and memory units in the computing and memory chip are divided into 4 regions, an instruction buffer region, a data region, an assistive region, and an instruction region, according to functions. The instruction buffer region is configured to buffer an instruction to be decoded and executed. The data region is configured to store all related data. The assistive region is configured to buffer an intermediate result generated due to a multi-step implication during the computing process. The instruction region is configured to store all instructions to be executed. The instruction buffer region has a total of 1 computing and memory unit. The data region has a total of P computing and memory units. The assistive region has a total of Q computing and memory units. The instruction region has a total of R computing and memory units. The values of P, Q, and R are set according to actual requirements, but the quantitative relationship of N=P+Q+R+1 must be satisfied. The assistive region of the chip is subdivided into several assistive blocks according to functions. Each assistive block buffer s the intermediate result generated due to the multi-step implication during execution of a specific data computation or data operation. Since the implication steps to be executed to complete a specific data computation or data operation are fixed, the number of computing and memory units contained in each assistive block is a fixed value.

Furthermore, each computing and memory unit is provided with the marking units, which are connected in series with the M memristive units in each row through the word line. The marking unit includes an X-bit of complementary metal-oxide-semiconductor (CMOS) transistor. The X-bit of includes a selected bit p, 2 bits of voltage determination bits v1 and v2, and X−3 bits of connection bits c1, c2, ..., cX−3. The selected bit p is configured to mark the computing and memory unit selected by the row selection module. If a certain computing and memory unit is selected by the row selection module, a selected position bit of the computing and memory unit is 1. A selected position bit of a computing and memory unit that is not selected or has completed a data computation or data operation is 0. The 2 bits of voltage determination bits v1 and v2 are configured to mark the type of voltage that should be applied to the computing and memory unit, and are only valid when the selected bit p=1. If v1 and v2 are set to 00, a voltage $V_{CLEAR}$ is applied to the computing and memory unit. If v1 and v2 are set to 01, a voltage $V_{COND}$ is applied to the computing and memory unit. If v1 and v2 are set to 10, a voltage $V_{SET}$ is applied to the computing and memory unit. If v1 and v2 are set to 11, no voltage is applied to the computing and memory unit. The X−3 bits of connection bits c1, c2, ... cX−3 are configured to mark whether a certain computing and memory unit is connected with other computing and memory units for implication, and are only valid when the selected bit p=1. If c1, c2, ..., cX−3 are set to all 0s, it means that the computing and memory unit does not form a path with any computing and memory unit. If c1, c2, ..., cX−3 are not all 0s, then the computing and memory unit forms a path with another computing and memory unit with c1, c2, ..., cX−3 of the same value through a connection switch for implication. Except when all 0s, a maximum of $2^{X-3}-1$ concurrent implications may be supported, as well as an unlimited number of clear 0 and set 1.

Furthermore, the voltage supply module is configured to apply voltages for implementing the clear 0, implication, and set 1 to the computing and memory unit. The voltage supply module includes a selected sensing unit and 3 voltage pulse generators. The selected sensing unit is configured to search for all computing and memory units in the chip whose selected bit p is set to 1 and obtain the values of the voltage determination bits v1 and v2 in the marking unit thereof. The 3 voltage pulse generators $V_{CLEAR}$, $V_{COND}$, and $V_{SET}$ are configured to apply one of voltage pulses $V_{CLEAR}$, $V_{COND}$, and $V_{SET}$ to the computing and memory unit. The voltage pulse generator determines which voltage pulse should be applied to which computing and memory unit according to the selected bit p obtained by the selected sensing unit and the values of the voltage determination bits v1 and v2.

Further, the reduced instruction set processor further includes a program counter PC, which is configured to record the on-chip address of the next instruction to be executed; an address register set, which has a total of 32 address registers sequentially numbered as R0 to R31, configured to buffer the on-chip addresses of some of the computing and memory units, and serving as an operand field in the instruction, the bit number of each address register is $\log_2 N$, and the value of R0 is always 0 without buffering any on-chip address; a row selection module, which selects the computing and memory unit of the corresponding address in the chip according to the value of the PC or the address register for subsequent data computation or data operation, and after the row selection module selects a computing and memory unit, the selected bit p of the computing and memory unit is set to 1; a column selection module, which turns on the bit line switches of some or all of the memristive units of the computing and memory unit selected by the row selection module according to the data bit number of the operation specifically required by the instruction to control which memristive units of the computing and memory unit will participate in the computation; and an instruction decoder and controller, which is configured to decode and analyze the instruction in the instruction buffer, and provide a corresponding control signal according to a decoding result to complete the execution of the instruction.

Furthermore, the reduced instruction set processor further includes instruction modules. The instruction modules include a basic integer instruction module, a single-precision floating point instruction module, and a double-precision floating point instruction module. Each instruction module is implemented on one or more chips. The corresponding chip is selected to run according to requirements, so as to satisfy different application scenarios. The word length of the processor is M bits, and the length of the instruction is M bits. The types of instructions include a data operation instruction, a logic operation instruction, an arithmetic operation instruction, and a branch/jump instruction. The data operation instruction includes a null instruction, a move instruction, an move immediate instruction, a shift left logical instruction, a shift left logical immediate instruction, a shift right logical instruction, a shift right logical immediate instruction, a shift right arithmetic immediate instruction, a shift right arithmetic immediate instruction, a sign extension instruction, a sign extension immediate instruction, a zero extension instruction, and an zero extension immediate instruction. The logic operation instruction includes an AND instruction, an AND immediate instruction, an OR instruction, an OR immediate instruction, a NOT instruction, a NOT immediate instruction, an XOR instruction, an XOR immediate instruction, a NAND instruction, and a NAND immediate instruction. The arithmetic operation instruction includes an add instruction, an add unsigned instruction, an add immediate instruction, and an add immediate unsigned instruction. The branch/jump instruction includes an unconditional jump instruction, an unconditional jump immediate instruction, a branch if equal instruction, a branch if equal immediate instruction, a branch if not equal instruction, and a branch if not equal immediate instruction.

Further, the highest 2 bits of the processor instruction are extended sign bits. The extended sign includes "00", "01", and "10". The extended sign "00" represents an R-type instruction, and a source operand and a destination operand are both address registers. The extended sign "01" represents an I-type instruction, a source operand is an immediate and an address register, and a destination operand is an address register. The extended sign "10" represents a J-type instruction, and are all branch target addresses except for the extended sign and an operation code. The extended sign also includes "11", which represents an illegal instruction.

The disclosure also provides a multi-chip parallel architecture processor based on a memristor, which includes a main chip and a total of Z computing chips. The main chip is used for memory, instruction processing, and task allocation, and is divided into a data region, an instruction region, and an instruction buffer. The computing chip is used for computation and the computing chip only includes an assistive region. There is a data path existed between the main chip and the computing chip. Data is transmitted between the main chip and the computing chip through the data path. Under the multi-chip parallel architecture, the instruction fetching, decoding, and address selection are serially executed one by one, the data is transmitted between the main chip and the computing chip through the data path, and the process of each computing chip executing a computing task may be performed in parallel. Therefore, the multi-chip parallel architecture can effectively improve the instruction processing speed.

Through the above technical solution conceived by the disclosure, compared with the architecture of memory and computation separation of modern computers, due to the memory and computation fusion characteristic and the in-situ computation characteristic of the reduced instruction set processor based on a memristor, the data in the chip may be directly calculated in situ through the implication operation while the data is stored in the chip.

DETAILED DESCRIPTION OF DISCLOSED EMBODIMENTS

Figure 1:
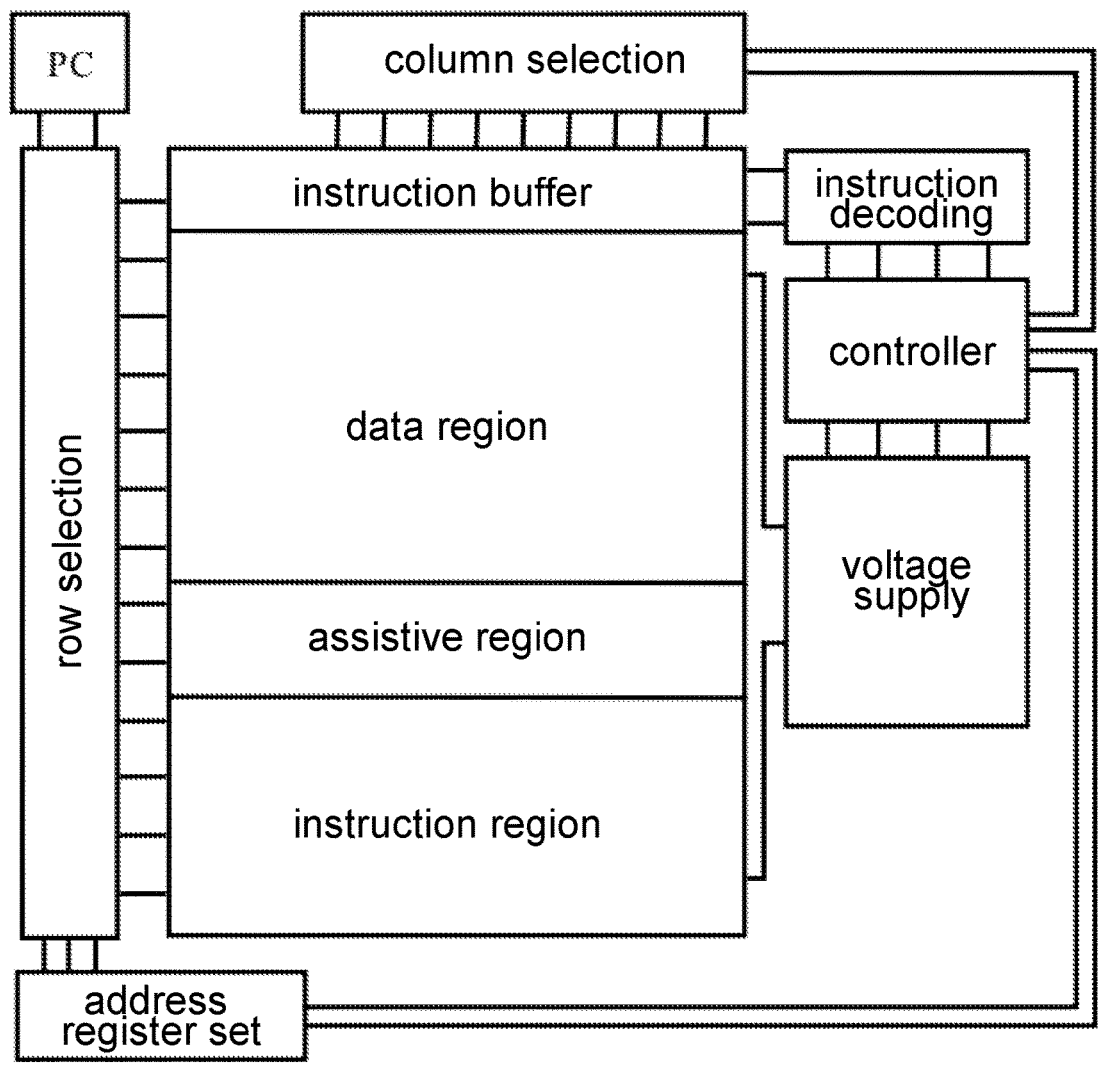
FIG. 1 is a schematic diagram of a hardware structure of a reduced instruction set processor based on a memristor.

For the objective, technical solution, and advantages of the disclosure to be clearer, the disclosure is further described in detail below with reference to the accompanying drawings and the embodiments. It should be understood that the specific embodiments described here are only configured to explain the disclosure, but not to limit the disclosure.

The disclosure provides a reduced instruction set processor based on a memristor, which includes a computing and memory chip based on a memristor (referred to as a COMEM chip) as the core part of the processor. The computing and memory chip includes:

N computing and memory units (abbreviated as CMU hereinafter). Each CMU serves as a row of the chip and corresponds to an on-chip address. Each CMU includes M memristive units, marking units, and connection switches. Each memristive unit includes a bit line switch and a memristor connected in series. Any two of the N CMUs may be connected through the connection switch located on a word line.

The M memristive units, marking units, and connection switches in each row are connected in series through the word line to form the CMU. One end of the word line is configured to connect a row selection module, and the other end is configured to connect a voltage supply module. The memristive units representing the same bit in all the CMUs are connected in series through a bit line. One end of the bit line is grounded, and the other end is configured to connect a column selection module.

M is a positive integer greater than or equal to 8 and is usually a multiple of 8. The value of N is set according to actual requirements.

The N CMUs of the computing and memory chip, according to functions performed, are divided into 4 regions, which includes an instruction buffer region, a data region, an assistive region, and an instruction region.

The instruction buffer region is configured to buffer an instruction to be decoded and executed. The data region is configured to store all related data. The assistive region is configured to buffer an intermediate result generated due to a multi-step implication during the computing process. The instruction region is configured to store all instructions to be executed.

The instruction buffer region has a total of 1 CMU. The data region has a total of P CMUs. The assistive region has a total of Q CMUs. The instruction region has a total of R CMUs. The values of P, Q, and R are set according to actual requirements, but the quantitative relationship of N=P+Q+R+1 must be satisfied.

The assistive region of the chip is subdivided into several assistive blocks according to functions performed. Each assistive block buffers the intermediate result generated due to the multi-step implication during execution of a specific data computation or data operation. Since the implication steps to be executed to complete a specific data computation or data operation are fixed, the number of CMUs contained in each assistive block is a fixed value.

Further includes:
the marking units, each CMU is further provided with the marking units, which are connected in series with the M memristive units in each row through the word line. The marking unit includes an X-bit of complementary metal-oxide-semiconductor (CMOS) transistor (or a two-end selector, a self-selector, etc.), which respectively represent a selected bit p, configured to mark the CMU selected by the row selection module, and if a certain CMU is selected by the row selection module, a selected position bit of the CMU is 1, and a selected position bit of a CMU that is not selected or has completed a data computation or data operation is 0;

2 bits of voltage determination bits v1 and v2, configured to mark the type of voltage that should be applied to the computing and memory unit, and only valid when the selected bit p=1. If v1 and v2 are set to 00, a voltage $V_{CLEAR}$ is applied to the CMU. If v1 and v2 are set to 01, a voltage $V_{COND}$ is applied to the CMU. If v1 and v2 are set to 10, a voltage $V_{SET}$ is applied to the CMU. If v1 and v2 are set to 11, no voltage is applied to the CMU.

X−3 bits of connection bits c1, c2, . . . , cX−3 are configured to mark whether a certain CMU is connected with other computing and memory units for implication, and are only valid when the selected bit p=1. If c1, c2, . . . , cX−3 are set to all 0s, it means that the CMU does not form a path with any CMU. If c1, c2, . . . , cX−3 are not all 0s, then the CMU forms a path with another CMU with c1, c2, . . . , cX−3 of the same value through a connection switch for implication. Except when all 0s, a maximum of $2^{X-3}-1$ concurrent implications may be supported, as well as an unlimited number of clear 0 and set 1.

Figure 4:
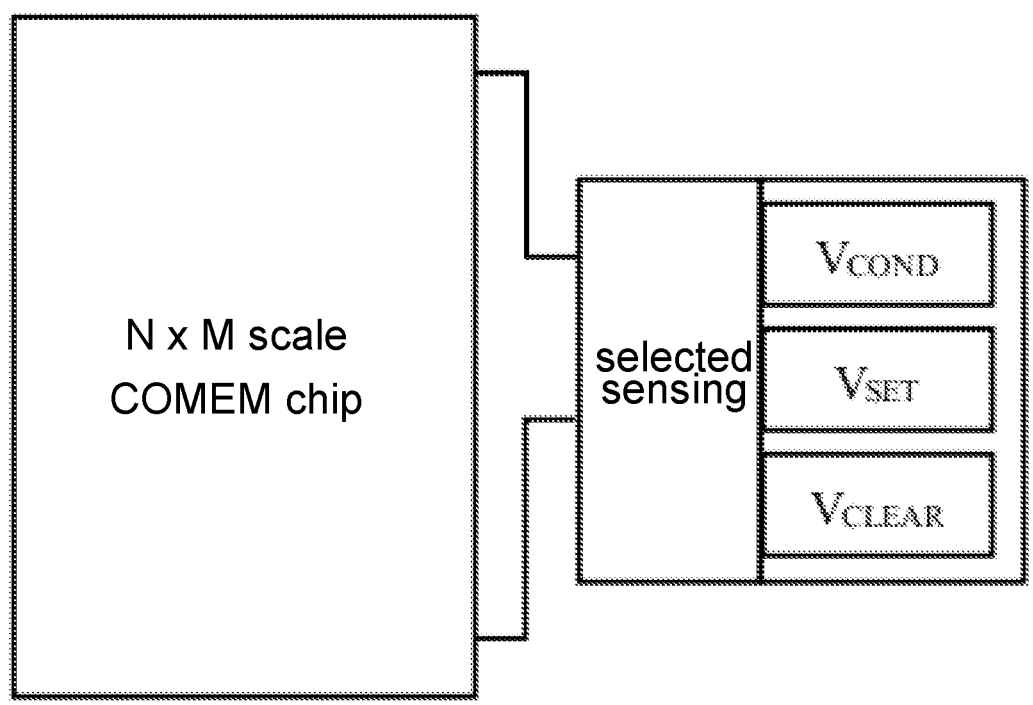
FIG. 4 is a schematic diagram of a structure of a voltage supply module.

Further includes:

the voltage supply module, configured to apply voltages for implementing clear 0, implication, and set 1 to the CMU. As shown in FIG. 4, the voltage supply module includes a selected sensing unit, configured to search for all CMUs in the chip whose selected bit p is set to 1 and obtain the values of the voltage determination bits v1 and v2 in the marking unit thereof; and 3 voltage pulse generators $V_{CLEAR}$, $V_{COND}$, and $V_{SET}$, configured to apply one of voltage pulses $V_{CLEAR}$, $V_{COND}$, and $V_{SET}$ to the CMU. The voltage pulse generator determines which voltage pulse should be applied to which CMU according to the selected bit p obtained by the selected sensing unit and the values of the voltage determination bits v1 and v2.

A program counter PC is configured to record the on-chip address of the next instruction to be executed;

an address register set has a total of 32 address registers, sequentially numbered as R0 to R31, which are configured to buffer the on-chip addresses of some of the CMUs and serve as an operand field in the instruction. The bit number of each address register is $\log_2 N$. The value of R0 is always 0 without buffering any on-chip address;

a row selection module selects the CMU of the corresponding address in the chip according to the value of the PC or the address register for subsequent data computation or data operation. After the row selection module selects a CMU, the selected bit p of the CMU is set to 1.

A column selection module turns on the bit line switches of some or all of the memristive units of the CMU selected by the row selection module according to the data bit number of the operation specifically required by the instruction to control which memristive units (bits) of the CMU will participate in the computation.

An instruction decoder and controller decodes and analyzes the instruction in the instruction buffer, and provides a corresponding control signal according to a decoding result to complete the execution of the instruction.

An instruction system of the processor is developed in a modular form. Instruction modules include a basic integer instruction module, a single-precision floating point instruction module, and a double-precision floating point instruction module. Each instruction module is implemented on one or more chips. The corresponding chip is selected to run according to requirements in the actual situation, so as to satisfy different application scenarios.

The word length of the processor is M bits, and the length of the instruction is M bits. The types of instructions include a data operation instruction, a logic operation instruction, an arithmetic operation instruction, and a branch/jump instruction.

The data operation instruction includes a null instruction, a data movement instruction, a move immediate instruction, a shift left logical instruction, a shift left logical immediate instruction, a shift right logical instruction, a shift right immediate instruction, a shift right arithmetic instruction, a shift right arithmetic immediate instruction, a sign extension instruction, a sign extension immediate instruction, a zero extension instruction, and a zero extension immediate instruction.

The logic operation instruction includes an AND logic instruction, an AND logic immediate instruction, an OR logic instruction, an OR logic immediate instruction, a NOT logic instruction, a NOT logic immediate instruction, an XOR logic instruction, an XOR logic immediate instruction, a NAND logic instruction, and a NAND logic immediate instruction.

The arithmetic operation instruction includes an add instruction, an add unsigned instruction, an add immediate instruction, and an add immediate unsigned instruction.

The branch/jump instruction includes an unconditional jump instruction, an unconditional jump immediate instruction, a branch if equal instruction, a branch if equal immediate instruction, a branch if not equal instruction, and a branch if not equal immediate instruction.

The highest 2 bits of the processor instruction are extended sign bits. The extended sign includes "00", "01", and "10". The extended sign "00" represents an R-type instruction, and a source operand and a destination operand are both address registers. The extended sign "01" represents an I-type instruction, a source operand is an immediate and an address register, and a destination operand is an address register. The extended sign "10" represents a J-type instruction, and are all branch target addresses except for the extended sign and an operation code. The extended sign also includes "11", which represents an illegal instruction.

For the objective, technical solution, and advantages of the disclosure to be clearer, the disclosure is further described in detail below by taking a computing and memory chip with N=1024, M=32, and X=5 and a basic integer instruction module as an example in conjunction with the accompanying drawings. It should be understood that the specific embodiments described here are only configured to explain the disclosure.

The reduced instruction set processor based on a memristor as shown in FIG. 1 includes:

a computing and memory chip based on a memristor as the core part of the processor. There are a total of 1024 CMUs on the computing and memory chip. Each CMU serves as a row of the chip and corresponds to an on-chip address of $\log_2 1024=10$ bits.

The 1024 CMUs of the computing and memory chip are divided into 4 regions, an instruction buffer region, a data region, an assistive region, and an instruction region, according to functions. The on-chip address range and the number of CMUs in each region are shown in Table 1.

TABLE 1

| Address allocation of regions of chip | | |
|---|---|---|
| Region | Address range | Number of CMU |
| Instruction buffer | 0x000 | 1 |
| Data region | 0x001~0x1FF | 511 |
| Assistive Region | 0x200~0x2FF | 256 |
| Instruction region | 0x300~0x3FF | 256 |

The assistive region of the chip is subdivided into several assistive blocks according to functions. Each assistive block buffers an intermediate result generated due to a multi-step implication during execution of a specific data computation or data operation. Since the implication steps to be executed to complete a specific data computation or data operation are fixed, the number of CMUs contained in each assistive block is a fixed value. Table 2 shows the number and naming of the CMU of some assistive blocks. In order to facilitate the description of the basic operation of the memristor, the assistive CMU is named according to the "assistive data computation or data operation+serial number". The name instead of the on-chip address thereof is used in the descriptions of the clear 0, implication, and set 1 operations of the memristor.

TABLE 2

Allocation and naming of some assistive blocks in assistive region of chip

| Operation or computation | Number of assistive CMU | Name |
|---|---|---|
| Move | 1 | MOV1 |
| Shift right arithmetic | 2 | SRA1~SRA2 |
| Shift right arithmetic immediate | 3 | SRAI0~SRAI2 |
| Sign extension | 0 | — |
| Sign extension immediate | 1 | SNEI0 |
| Exclusive or | 5 | XOR1~XOR5 |
| Exclusive or immediate | 6 | XORI0~XORI5 |
| Branch if equal | 1 | BEQ1 |
| Branch if equal immediate | 2 | BEQI0~BEQI1 |
| Unconditional jump | 0 | — |
| Unconditional jump immediate | 1 | JARI0 |
| add | 5 | ADD1~ADD5 |
| Addition immediate | 6 | ADDI0~ADDI5 |

The assistive unit with the largest serial number of each assistive block, such as SRA2, XOR5, etc., is configured to buffer the result of the data computation or data operation. If the buffered result needs to be output to another CMU, the move instruction can be performed once for the outputting the buffered result.

Data computation and operation containing immediate need an additional assistive unit for writing the immediate. The serial number of the assistive unit for temporarily storing the immediate is specified as 0, such as SRAI0, ADDI0, etc.

There are also some special cases, for example, a sign extension operation SNE and an unconditional jump operation JAR do not need assistive units; an sign extension operation immediate SNEI and an unconditional jump operation immediate JARI only need 1 assistive unit SNEI0 for writing the immediate and temporarily storing the operation result; and the move operation does not need a unit for temporarily storing the intermediate result, etc.

There are some data operations and computations are required to call other operations and computations to complete specified functions. For example, the add operation needs to call the XOR and NAND operations, and the branch if equal immediate operation needs to call the sign extension operation and the XOR operation. Those called operations and computations are still completed in their respective assistive blocks, and the obtained results are then written back to the operations and computations that called them through the data movement operation.

Figure 2:
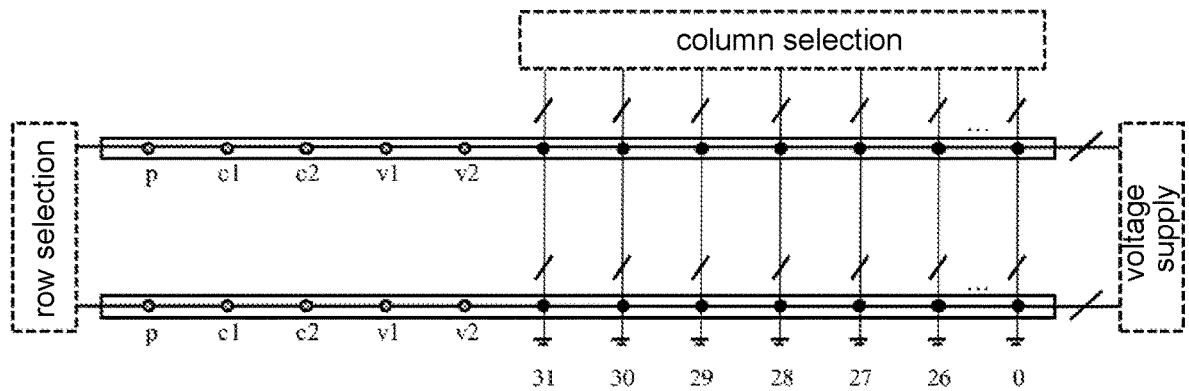
FIG. 2 is a schematic diagram of a structure of a computing and memory unit inside a chip.

The structure of the CMU is shown in FIG. 2. Each CMU includes 32 memristive units, marking units, and connection switches. Each memristive unit includes a bit line switch and a memristor connected in series. Any two CMUs may be connected through the connection switch located on a word line.

The 32 memristive units, marking units, and connection switches in each row are connected in series through the word line to form the CMU. One end of the word line is configured to connect a row selection module, and the other end is configured to connect a voltage supply module. The memristive units representing the same bit in all the CMUs are connected in series through a bit line. One end of the bit line is grounded, and the other end is configured to connect a column selection module. Any two of the 1024 CMUs may be connected through the connection switch located on the word line when implication needs to be performed.

Each CMU is provided with the marking units, which are connected in series with the 32 memristive units in each row through the word line. The marking unit includes a 5-bit CMOS transistor, which respectively represent:

a selected bit p, configured to mark the CMU selected by the row selection module, and if a certain CMU is selected by the row selection module, a selected position bit of the CMU is 1, and a selected position bit of a CMU that is not selected or has completed a data computation or data operation is 0;

2 bits of voltage determination bits v1 and v2, configured to mark the type of voltage that should be applied to the computing and memory unit, and only valid when the selected bit p=1. If v1 and v2 are set to 00, a voltage $V_{CLEAR}$ is applied to the CMU. If v1 and v2 are set to 01, a voltage $V_{COND}$ is applied to the CMU. If v1 and v2 are set to 10, a voltage $V_{SET}$ is applied to the CMU. If v1 and v2 are set to 11, no voltage is applied to the CMU.

Figure 3:
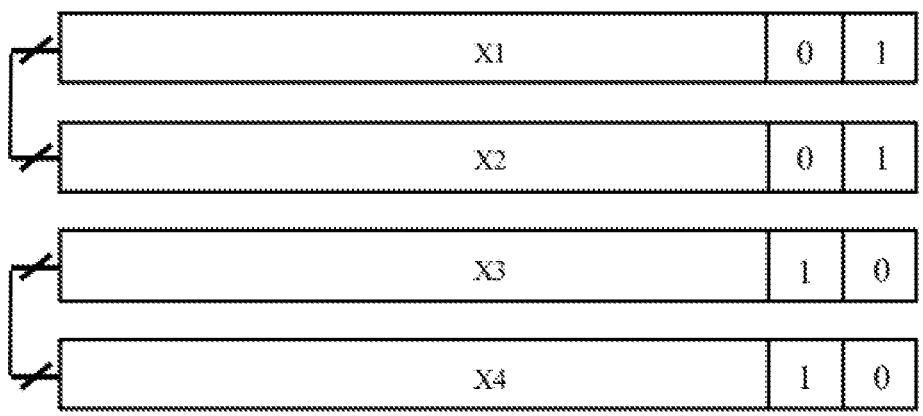
FIG. 3 is a schematic diagram of connection switches and connection positions.

2 bits of connection bits c1 and c2 are configured to mark whether a certain CMU is connected with other computing and memory units for implication, and are only valid when the selected bit p=1 as shown in FIG. 3. If c1 and c2 are set to all 0s, it means that the CMU does not form a path with any CMU. If c1 and c2 are not all 0s, then the CMU forms a path with another CMU with c1 and c2 of the same value through a connection switch for implication. Except when all 0s, a maximum of 3 concurrent implications may be supported, as well as an unlimited number of clear 0 and set 1.

The reduced instruction set processor based on a memristor also includes some modules that support instruction processing and execution, which include:

the voltage supply module, configured to apply voltages for implementing clear 0, implication, and set 1 to the CMU. The voltage supply module includes a selected sensing unit, configured to search for all CMUs in the chip whose selected bit p is set to 1 and obtain the values of the voltage determination bits v1 and v2 in the marking unit thereof; and 3 voltage pulse generators $V_{CLEAR}$, $V_{COND}$, and $V_{SET}$, configured to apply one of voltage pulses $V_{CLEAR}$, $V_{COND}$, and $V_{SET}$ to the CMU. The voltage pulse generator determines which voltage pulse should be applied to which CMU according to the selected bit p obtained by the selected sensing unit and the values of the voltage determination bits v1 and v2.

A program counter PC is configured to record the on-chip address of the next instruction to be executed;

an address register set has a total of 32 address registers, sequentially numbered as R0 to R31, which are configured to buffer the on-chip addresses of some of the CMUs and serve as an operand field in the instruction. The bit number of each address register is $\log_2 1024 = 10$ bits. The value of R0 is always 0 without buffering any on-chip address;

a row selection module selects the CMU of the corresponding address in the chip according to the value of the PC or the address register for subsequent data computation or data operation. After the row selection module selects a CMU, the selected bit p of the CMU is set to 1.

A column selection module turns on the bit line switches of some or all of the memristive units of the CMU selected by the row selection module according to the data bit number of the operation specifically required by the instruction to control which memristive units (bits) of the CMU will participate in the computation.

An instruction decoder and controller decodes and analyzes the instruction in the instruction buffer, and provides a corresponding control signal according to a decoding result to complete the execution of the instruction.

Example 1 is completed on the reduced instruction set processor based on a memristor. The following concurrent operations are implemented on the units with on-chip addresses of A1 to A6. Implication operation A2[11:0]←A1[11:0] IMP A2[11:0] is implemented on the units A1 and A2. Implication operation A4-A3 IMP A4 is implemented on the units A3 and A4. Implication operation CLEAR (A5[31:16]) is implemented on the unit A5. No operation is performed on the unit A6.

The operation sequence of Embodiment 1 is as follows, and before the operation starts, all bit line switches and connection switches are in the turned off state by default:

(1.1) The row selection module selects the 6 CMUs of the corresponding addresses, and sets all the selected bits p thereof to 1.

(1.2) One round of marking of position bits is performed:

| CMU | c1 | c2 | v1 | v2 |
|---|---|---|---|---|
| A1 | 0 | 1 | 0 | 1 |
| A2 | 0 | 1 | 1 | 0 |
| A3 | 1 | 0 | 0 | 1 |
| A4 | 1 | 0 | 1 | 0 |
| A5 | 0 | 0 | 0 | 0 |
| A6 | 0 | 0 | 1 | 1 |

(1.3) The connection switch connects A1 and A2, connects A3 and A4, and A5 and A6 are not connected to any unit according to the values of the connection bits c1 and c2. The column selection module cooperates with the row selection module to turn on the 11-0 bits of bit line switches of A1 and A2, turn on all the 32 bits of bit line switches of A3 and A4, and turn on the 31-16 bits of line switches of A5.

(1.4) After the voltage supply module finds all the units with p=1, the voltage supply module applies the voltage $V_{COND}$ to A1 and A3, the voltage $V_{SET}$ to A2 and A4, and the voltage $V_{CLEAR}$ to A5 according to the values of the voltage determination bits v1 and v2, so as to implement the concurrent implication operations A2[11:0]←A1[11:0] IMP A2[11:0], A4←A3 IMP A4, and clear operation CLEAR (A5[31:16]). No operation is performed on A6. After completion, the connection switches and the bit line switches of A1 to A6 are turned off.

(1.5) Finally, the selected bits p of A1 to A6 are all set to 0.

Figures 5, 6:
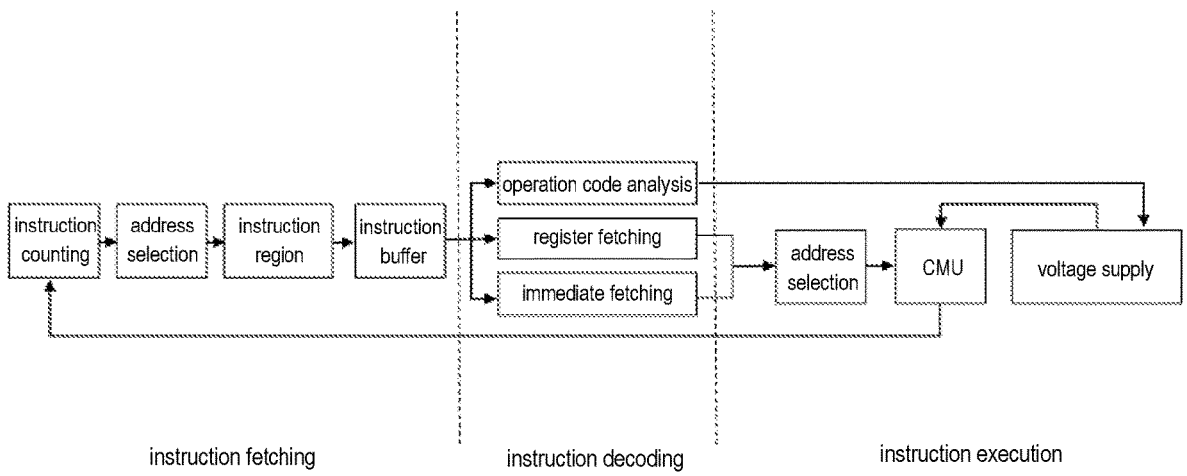
FIG. 5 is a schematic diagram of a reduced instruction set processor based on a memristor instruction format.
FIG. 6 is a schematic diagram of a reduced instruction set processor based on a memristor instruction flow.

The instruction system is exemplified with a 32-bit of fixed-length instruction of the basic integer instruction module. The instruction type of the reduced instruction set processor based on a memristor instruction system is divided into three types, R-type, I-type, and J-type, which are determined by the highest 2 extended sign bits of the instruction. The extended sign bit "00" is the R-type instruction, "01" is the I-type instruction, "10" is the J-type instruction, and "11" is an illegal instruction. The illegal instruction is configured to implement the later upgrade and extension of the reduced instruction set processor based on a memristor. The instruction format is as shown in FIG. 5, where opcode is the operation code; rd is the destination address register; rs1 is a source address register 1; rs2 is a source address register 2; #imm is the immediate; #shamt is the number of bit shift; and #label is the branch/jump target address.

When the extended sign bit is "00", the processor instruction formats from high to low are sequentially 2 bits of extended sign, 5 bits of operation code, 5 bits of destination address register, 5 bits of source address register 1, 5 bits of source address register 2, 5 bits being all 0s, and 5 bits of data bit shift.

When the extended sign bit is "01", the processor instruction formats from high to low are sequentially bits of extended sign, 5 bits of operation code, 5 bits of destination address register, 5 bits of source address register, 10 bits of immediate, and 5 bits of data bit shift.

When the extended sign bit is "10", the processor instruction formats from high to low are sequentially 2 bits of extended sign, 5 bits of operation code, 25 bits of branch/jump target address/5 bits of destination address register+20 bits being all 0s.

When the extended sign bit is "11", the processor instruction formats from high to low are sequentially 2 bits of extended sign and 30 bits of undefined word. The specific instructions are defined as shown in Table 3:

TABLE 3

Instructions contained in 32-bit of fixed-length instruction basic integer instruction module.

| Instruction name | Mnemonic | Instruction function |
|---|---|---|
| R-type | | |
| Null instruction | nop | — |
| Move | mov | The data in the CMU pointed to by the source address register rs is written into the CMU pointed to by the destination address register rd. |
| Sign extension | sne | Sign extension to 32 bits is performed on the data in the CMU pointed to by the source address register rs, and the result is written into the CMU pointed to by the destination address register rd. |
| Zero extension | zre | Zero extension to 32 bits is performed on the data in the CMU pointed to by the source address register rs, and the result is written into the CMU pointed to by the destination address register rd. |
| Shift left logical | sll | The data in the CMU pointed to by the source address register rs is logically shifted to left by #shamt bit, and the result is written into the CMU pointed to by the destination address register rd. |
| Shift right logical | srl | The data in the CMU pointed to by the source address register rs is logically shifted to right by #shamt bit, and the result is written into the CMU pointed to by the destination address register rd. |

TABLE 3-continued

Instructions contained in 32-bit of fixed-length instruction basic integer instruction module.

| Instruction name | Mnemonic | Instruction function |
| --- | --- | --- |
| Shift right arithmetic | sra | The data in the CMU pointed to by the source address register rs is arithmetically shifted to right by #shamt bit, and the result is written into the CMU pointed to by the destination address register rd. |
| AND logic | and | AND logic operation is performed on the data in the CMU pointed to by the source address register rs1 and the data in the CMU pointed to by the source address register rs2, and the result is written into the CMU pointed to by the destination address register rd. |
| OR logic | or | OR logic operation is performed on the data in the CMU pointed to by the source address register rs1 and the data in the CMU pointed to by the source address register rs2, and the result is written into the CMU pointed to by the destination address register rd. |
| NOT logic | not | NOT logic operation is performed on the data in the CMU pointed to by the source address register rs, and the result is written into the CMU pointed to by the destination address register rd. |
| XOR logic | xor | XOR logic operation is performed on the data in the CMU pointed to by the source address register rs1 and the data in the CMU pointed to by the source address register rs2, and the result is written into the CMU pointed to by the destination address register rd. |
| NAND logic | nand | NAND logic operation is performed on the data in the CMU pointed to by the source address register rs1 and the data in the CMU pointed to by the source address register rs2, and the result is written into the CMU pointed to by the destination address register rd. |
| Add | add | The data in the CMU pointed to by the source address register rs1 and the data in the CMU pointed to by the source address register rs2 are added as signed numbers, and the result is written into the CMU pointed to by the destination address register rd. |
| Add unsigned | addu | The data in the CMU pointed to by the source address register rs1 and the data in the CMU pointed to by the source address register rs2 are added as unsigned numbers, and the result is written into the CMU pointed to by the destination address register rd. |
| Branch if equal | beq | The data in the CMU pointed to by the source address register rs1 and the data in the CMU pointed to by the source address register rs2 are compared, and if equal, the next instruction jumps to the instruction in the CMU pointed to by the destination address register rd. |
| Branch if not equal | bne | The data in the CMU pointed to by the source address register rs1 and the data in the CMU pointed to by the source address register rs2 are compared, and if not equal, the next instruction jumps to the instruction in the CMU pointed to by the destination address register rd. |
| I-type | | |
| Move immediate | movi | The immediate #imm is written into the CMU pointed to by the destination address register rd. |
| Sign extension immediate | snei | Sign extension to 32 bits is performed on the immediate #imm, and the result is written into the CMU pointed to by the destination address register rd. |
| Zero extension immediate | zrei | Zero extension to 32 bits is performed on the immediate #imm, and the result is written into the CMU pointed to by the destination address register rd. |
| Shift left logical immediate | slli | The immediate #imm is logically shifted to left by #shamt bit, and the result is written into the CMU pointed to by the destination address register rd. |
| Shift right logical immediate | srli | The immediate #imm is logically shifted to right by #shamt bit, and the result is written into the CMU pointed to by the destination address register rd. |
| Shift right arithmetic immediate | srai | The immediate #imm is arithmetically shifted to right by #shamt bit, and the result is written into the CMU pointed to by the destination address register rd. |
| AND logic immediate | andi | Zero extension to 32 bits is performed on the immediate #imm, then AND logic operation is performed on the data in the CMU pointed to by the source address register rs, and the result is written into the CMU pointed to by the destination address register rd. |

TABLE 3-continued

Instructions contained in 32-bit of fixed-length instruction basic integer instruction module.

| Instruction name | Mnemonic | Instruction function |
|---|---|---|
| OR computation immediate | ori | Zero extension to 32 bits is performed on the immediate #imm, then OR logic operation is performed on the data in the CMU pointed to by the source address register rs, and the result is written into the CMU pointed to by the destination address register rd. |
| NOT logic immediate | noti | Zero extension to 32 bits is performed on the immediate #imm, then NOT logic operation is performed on the data in the CMU pointed to by the source address register rs, and the result is written into the CMU pointed to by the destination address register rd. |
| XOR logic immediate | xori | Zero extension to 32 bits is performed on the immediate #imm, then XOR logic operation is performed on the data in the CMU pointed to by the source address register rs, and the result is written into the CMU pointed to by the destination address register rd. |
| NAND logic immediate | nandi | Zero extension to 32 bits is performed on the immediate #imm, then NAND logic operation is performed on the data in the CMU pointed to by the address register source rs, and the result is written into the CMU pointed to by the destination address register rd. |
| Add immediate | addi | Zero extension to 32 bits is performed on the immediate #imm, then the data in the CMU pointed to by the source address register rs is added as signed numbers, and the result is written into the CMU pointed to by the destination address register rd. |
| Add immediate unsigned | addiu | Zero extension to 32 bits is performed on the immediate #imm, then the data in the CMU pointed to by the source address register rs is added as unsigned numbers, and the result is written into the CMU pointed to by the destination address register rd. |
| Branch if equal immediate | beqi | Zero extension to 32 bits is performed on the immediate #imm, which is then compared with the data in the CMU pointed to by the source address register rs, and if equal, the next instruction jumps to the instruction in the CMU pointed to by the destination address register rd. |
| Branch if not equal immediate | bnei | Zero extension to 32 bits is performed on the immediate #imm, which is then compared with the data in the CMU pointed to by the source address register rs, and if not equal, the next instruction jumps to the instruction in the CMU pointed to by the destination address register rd. |
| | | J-type |
| Unconditional jump | jar | The next instruction jumps to the instruction in the CMU pointed to by the destination address register rd |
| Unconditional jump immediate | jari | The next instruction jumps to the instruction in the CMU of an external memory or chip pointed to by the immediate #label. The #imm field has 25 bits, so addresses in the 225 range may be searched, which are not limited to the address of the CMU in the chip, and include addresses of the external memory or virtual addresses. |
| | | Illegal instruction |
| Illegal | — | — |

The instruction codes of the above instructions are shown in Table 4. In the instruction code table, if the address register fields rs1, rs2, or rs are all 0s, it means that this instruction does not need this field, this field has no meaning in this instruction, and does not represent the register R0. In addition, if the instruction is nota data shift instruction, the #shamt field is all 0s.

TABLE 4

Instruction codes of 32-bit of fixed-length instruction basic integer instruction module R-type

| Instruction | 31~30 | 29~25 | 24~20 | 19~15 | 14~10 | 9~5 | 4~0 |
|---|---|---|---|---|---|---|---|
| nop | 00 | 00000 | 00000 | 00000 | 00000 | 00000 | 00000 |
| mov | 00 | 00001 | rd | rs | 00000 | 00000 | 00000 |

TABLE 4-continued

Instruction codes of 32-bit of fixed-length instruction basic integer instruction module

| sne | 00 | 00010 | rd | rs | 00000 | 00000 | 00000 |
|---|---|---|---|---|---|---|---|
| zre | 00 | 00011 | rd | rs | 00000 | 00000 | 00000 |
| sll | 00 | 00100 | rd | rs | 00000 | 00000 | #shamt |
| srl | 00 | 00101 | rd | rs | 00000 | 00000 | #shamt |
| sra | 00 | 00110 | rd | rs | 00000 | 00000 | #shamt |
| and | 00 | 00111 | rd | rs1 | rs2 | 00000 | 00000 |
| or | 00 | 01000 | rd | rs1 | rs2 | 00000 | 00000 |
| not | 00 | 01001 | rd | rs | 00000 | 00000 | 00000 |
| xor | 00 | 01010 | rd | rs1 | rs2 | 00000 | 00000 |
| nand | 00 | 01011 | rd | rs1 | rs2 | 00000 | 00000 |
| add | 00 | 01100 | rd | rs1 | rs2 | 00000 | 00000 |
| addu | 00 | 01101 | rd | rs1 | rs2 | 00000 | 00000 |
| beq | 00 | 01110 | rd | rs1 | rs2 | 00000 | 00000 |
| bne | 00 | 01111 | rd | rs1 | rs2 | 00000 | 00000 |

TABLE 4-continued

Instruction codes of 32-bit of fixed-length instruction basic integer instruction module

I-type

| Instruction | 31~30 | 29~25 | 24~20 | 19~15 | 14~5 | 4~0 |
|---|---|---|---|---|---|---|
| movi | 01 | 00001 | rd | 00000 | #imm | 00000 |
| snei | 01 | 00010 | rd | 00000 | #imm | 00000 |
| zrei | 01 | 00011 | rd | 00000 | #imm | 00000 |
| slli | 01 | 00100 | rd | 00000 | #imm | #shamt |
| slri | 01 | 00101 | rd | 00000 | #imm | #shamt |
| srai | 01 | 00110 | rd | 00000 | #imm | #shamt |
| andi | 01 | 00111 | rd | rs | #imm | 00000 |
| ori | 01 | 01000 | rd | rs | #imm | 00000 |
| noti | 01 | 01001 | rd | 00000 | #imm | 00000 |
| xori | 01 | 01010 | rd | rs | #imm | 00000 |
| nand | 01 | 01011 | rd | rs | #imm | 00000 |
| addi | 01 | 01100 | rd | rs | #imm | 00000 |
| addiu | 01 | 01101 | rd | rs | #imm | 00000 |
| beqi | 01 | 01110 | rd | rs | #imm | 00000 |
| bnei | 01 | 01111 | rd | rs | #imm | 00000 |

J-type

| Instruction | 31~30 | 29~25 | 24~20 | 19~15 | 14~10 | 9~5 | 4~0 |
|---|---|---|---|---|---|---|---|
| jar | 10 | 00000 | rd | 00000 | 00000 | 00000 | 00000 |
| jar | 10 | 00001 | | | #label | | |

Illegal

| Instruction | 31~30 | 29~0 |
|---|---|---|
| Illegal | 11 | — |

The reduced instruction set processor based on a memristor adopts a flow line manner for processing instructions, and divides the processing process of an instruction into three stages, instruction fetching, instruction decoding, and instruction execution, as shown in FIG. 6. The instruction is stored in the instruction region of the chip. The row selection module selects the CMU corresponding to the address of the instruction region of the chip according to the current value of the program counter, and the instruction is written into the instruction buffer through the data movement operation.

For instructions that are executed sequentially, after each instruction fetching is completed, the value of the program counter is +1, and the fetching stage of the next instruction is proceeded. If the instruction is a branch/jump instruction and satisfies the jump condition, the value of the program counter will be changed to the target address to be jumped.

Based on the basic operation of the memristor, Example 2 is completed. The on-chip address of the next instruction to be executed in the program counter is 0x31D, and the instruction fetching stage of the instruction is completed.

The operation sequence of Embodiment 2 is as follows, and before the operation starts, all bit line switches and connection switches are in the turned off state by default:

(2.1) the row selection module selects a CMU (which is recorded as a unit A for convenience of description) with the on-chip address 0x31D, an assistive unit MOV1 of the assistive region data movement assistive block, and an instruction buffer (which is recorded as a unit I for convenience of description) with the address 0x000 according to the value in the program counter, and sets all the selected bits p thereof to 1.

(2.2) One round of marking of position bits is performed:

| CMU | c1 | c2 | v1 | v2 |
|---|---|---|---|---|
| A | 0 | 0 | 1 | 1 |
| MOV1 | 0 | 0 | 0 | 0 |
| I | 0 | 0 | 0 | 0 |

(2.3) The column selection module cooperates with the row selection module to turn on all the 32 bits of bit line switches of MOV1 and I.

(2.4) The voltage supply module applies the voltage $V_{CLEAR}$ to MOV1 and I according to the values of v1 and v2, so as to implement concurrent clear 0 operations CLEAR (MOV1) and CLEAR(I). No operation is performed on A. After completion, the bit line switches of MOV1 and I are turned off.

(2.5) One round of marking of position bits is performed:

| CMU | c1 | c2 | v1 | v2 |
|---|---|---|---|---|
| A | 0 | 1 | 0 | 1 |
| MOV1 | 0 | 1 | 1 | 0 |
| I | 0 | 0 | 1 | 1 |

(2.6) The connection switch connects A to MOV1 according to the values of c1 and c2, and I is not connected to any unit. The column selection module cooperates with the row selection module to turn on all 32 bits of bit line switches of A and MOV1.

(2.7) After the voltage supply module finds all the units with p=1, the voltage supply module applies the voltage $V_{COND}$ to A and the voltage $V_{SET}$ to MOV1 according to the values of the voltage determination bits v1 and v2, so as to implement the implication operation MOV1←A IMP MOV1. No operation is performed on I. After completion, the bit line switches and the connection switches of A and MOV1 are turned off.

(2.8) One round of marking of position bits is performed:

| CMU | c1 | c2 | v1 | v2 |
|---|---|---|---|---|
| A | 0 | 0 | 1 | 1 |
| MOV1 | 0 | 1 | 0 | 1 |
| I | 0 | 1 | 1 | 0 |

(2.9) The connection switch connects MOV1 to I according to the values of c1 and c2, and A is not connected to any unit. The column selection module cooperates with the row selection module to turn on all 32 bits of bit line switches of MOV1 and I.

(2.10) The voltage supply module applies the voltage $V_{COND}$ to MOV1 and the voltage $V_{SET}$ to I according to the values of v1 and v2, so as to implement the implication operation I←MOV1 IMP I. No operation is performed on A. After completion, the bit line switches and the connection switches of MOV1 and I are turned off.

(2.11) Finally, the selected bits p of A, MOV1, and I are all set to 0.

The instruction fetching stage shown in Example 2 are the operation steps of the data movement, as well as the operation steps of the instruction fetching stage of all instructions.

It can be seen from Example 1 and Example 2 that in addition to the initial address generation, selection, and final deselection, one (or concurrent) implication/clear 0/set 1 operation has to go through the following steps: marking position bits→turning on connection/bit line switch→applying voltage to implement the implication/clear 0/set 1 operation→turning off the connect/bit line switch. In the subsequent instruction execution example, control steps such as marking the position bits, turning on the bit line/connection switch, and turning off the bit line/connection switch are omitted. Only the initial address generation, selection, implication/clear 0/set 1 operation needed to complete the instruction function, and the final deselection of the operation.

After the instruction fetching stage, the instruction decoding and execution stage is proceeded. The instruction decoder decodes the instructions in the instruction buffer completely, determines the instruction type according to the extended sign bit and the operation code, extracts the immediate and the address register field in the instruction, and selects the corresponding operation. The controller sends a control signal to complete the execution of the instruction. The execution stage of each instruction corresponds to different operation steps. The operation steps are composed of several implication/clear 0/set 1 operations to complete the functions described by the instruction. The following is the implementation manner of some instruction examples on the reduced instruction set processor based on a memristor.

The shift left logical instruction sll, shift left logical immediate instruction slli, shift right logical instruction srl, shift right logical immediate instruction srli, shift right arithmetic instruction sra, and shift right arithmetic immediate instruction srai all belong to data shift instructions with similar functions in the data operation instructions. Taking the shift right arithmetic instruction as an example now, and the implementation steps thereof are provided.

Example 3: shift right arithmetic instruction "sra R1, R2, #16". Assuming that R1=0x01F and R2=0x03A, the data in the CMU with the address 0x03A pointed to by the source address register R2 is arithmetically shifted to right by 16 bits, and the result is written into the CMU with the address 0x01F pointed to by the destination address register R1.

The implementation steps are as follows:

(3.1) The instruction is fetched. Refer to the operation steps for the instruction fetching in Example 2.

(3.2) After the instruction is decoded, the row selection module respectively selects the on-chip address 0x01F (which is recorded as a unit A1 for convenience of description), the on-chip address 0x03A (which is recorded as a unit A2 for convenience of description), and the assistive units SRA1 to SRA2 in the arithmetic shift right assistive block according to the values of the address registers R1 and R2, and the selected bits p thereof are all set to 1.

(3.3) The concurrent clear 0 operations CLEAR(A1), CLEAR(SRA1), and CLEAR(SRA2) are implemented.

(3.4) Initial i=16 and j=0. The implication operation SRA1 [j]←A2[i] IMP SRA1 [j] is implemented. After completion, i=i+1 and j=j+1. If i≤31 and j≤15, then the step is circulated. If i>31 and j>15, then the step ends.

(3.5) The highest bit of the data in A2 is read. If the highest bit is 1, then the SET 1 operation (SRA2[31:16]) is implemented. If the highest bit of the data in A2 is 0, the step is not executed.

(3.6) The implication operation SRA2[15:0]←SRA[15:0] IMP SRA1[15:0] is implemented.

(3.7) The data in SRA2 is written into A1 through a data movement operation.

(3.8) Finally, the selected bits p of A1, A2, SRA1, and SRA2 are all set to 0.

The sign extension instruction sne, the sign extension immediate instruction snei, the zero extension instruction zre, and the zero extension immediate instruction zeri all belong to data extension instructions with similar functions in the data operation instructions. Taking the immediate sign extension instruction as an example now, and the implementation steps thereof are provided.

Example 4: the sign extension immediate instruction "snei R25, #0x296". Assuming that R25=0x091, sign extending to 32 bits is performed on the immediate 0x296 (1010010110), and the result written into the CMU with the address 0x091 pointed to by the destination address register R25.

The implementation steps areas follows:

(4.1) The instruction is fetched. Refer to the operation steps for the instruction fetching in Example 2.

(4.2) After the instruction is decoded, the row selection module selects the on-chip address 0x091 (which is recorded as a unit A for convenience of description) and the address of the assistive unit SNEI0 in the immediate sign extension assistive block according to the value of the address register R25, and the selected bits p thereof are set to 1.

(4.3) The concurrent clear 0 operations CLEAR(A) and CLEAR(SNEI0) are implemented.

(4.4) The immediate 0x296 is written into SNEI0.

(4.5) The highest bit of the data in SNEI0 is read, the highest bit thereof is read as 1, and the set 1 operation SET(SNEI0[31:10]) is implemented. (If the highest bit of the data is 0, the step is not executed).

(4.6) The data in SNEI0 is written into A through a data movement operation.

(4.7) Finally, the selected bits p of A and SNEI0 are all set to 0.

The AND instruction and, AND immediate instruction andi, OR instruction or, OR immediate instruction ori, NOT instruction not, NOT immediate instruction noti, XOR instruction xor, XOR immediate instruction xori, NAND instruction nand, and NAND immediate instruction nandi all belong to logic operation instructions with similar functions. Taking the XOR instruction as an example now, and the implementation steps thereof are provided.

Example 5: XOR instruction "xor R10, R3, R17". Assuming that R10=x010, R3=0x011, and R17=0x012, logic XOR operation is performed on the data in the CMU with the address 0x011 pointed to by the source address register R3 and the data in the CMU with the address 0x012 pointed to by the source address register R17, and the result is written into the CMU with the address 0x010 pointed to by the destination address register R10.

The implementation steps are as follows:

(5.1) The instruction is fetched. Refer to the operation steps for the instruction fetching in Example 2.

(5.2) After the instruction is decoded, the row selection module selects the on-chip address 0x010 (which is recorded as a unit A3 for convenience of description), the on-chip address 0x011 (which is recorded as a unit A2 for convenience of description), the on-chip address 0x012 (which is recorded as a unit A1 for convenience of description), and the addresses of the assistive units XOR1 to XOR5 in the logic XOR assistive block, and the selected bits p thereof are all set to 1.

(5.3) The concurrent clear 0 operations CLEAR(A3), CLEAR(XOR0), CLEAR(XOR1), CLEAR(XOR2), CLEAR(XOR3), CLEAR(XOR4), and CLEAR(XOR5) are implemented.

(5.4) The concurrent implication operations XOR1←A1 IMP XOR1 and XOR2←A2 IMP XOR2 are implemented.

(5.5) The concurrent implication operations XOR3←XOR1 IMP XOR3 and XOR4←XOR2 IMP XOR4 are implemented.

(5.5) The concurrent implication operations XOR3←A2 IMP XOR3 and XOR4←A1 IMP XOR4 are implemented.

(5.6) The implication operation XOR5←XOR3 IMP XOR5 is implemented.

(5.7) The implication operation XOR5←XOR4 IMP XOR5 is implemented.

(5.8) The data in XOR5 is written into A3 through a data move operation.

(5.9) Finally, the selected bits p of A1 to A3 and XOR1 to XOR5 are all set to 0.

The branch if equal instruction beq, branch if equal immediate beqi, branch if not equal instruction bne, and branch if not equal immediate instruction bnei all belong to conditional jump instructions with similar functions in the branch/jump instructions. Taking the branch if equal immediate as an example now, and the implementation steps thereof are provided.

Example 6: branch instruction if equal immediate "beqi, R1, R2, #x001". Assuming that R1=0x3FD and R2=0x10C, sign extension to 32 bits is performed on the immediate #0x001, which is then compared with the data in the CMU with the address 0x10C pointed to by the source address register R2. If equal, the next instruction jumps to the instruction in the CMU with the address 0x3FD pointed to by the destination address register R1, and it is assumed that the data in the CMU with the address 0x10C is 0x0000001.

The implementation steps are as follows:

(6.1) The instruction is fetched. Refer to the operation step for the instruction fetching in Example 2.

(6.2) After the instruction is decoded, the row selection module selects the on-chip address 0x3FD (which is recorded as a unit A1 for convenience of description) and the on-chip address 0x10C (which is recorded as a unit A2 for ease of description), and the addresses of the assistive units BEQI0 to BEQI1 in the assistive block of branch if equal immediate according to the values of the address registers R1 and R2, and the selected bits p thereof are all set to 1.

(6.3) The immediate #0x001 is written into BEQI0 through one immediate sign extension operation, and sign extension to 32 bits is performed.

(6.4) The XOR operation is performed on the data in BEQI0 and the data in A2, and the result is written into BEQI1.

(6.5) If the XOR result in BEQI1 is 0, it means equal, and the address of the next instruction to be executed in the program counter is changed to the address A1 (0x3FD) in R1.

(6.6) Finally, the selected bits p of A1, A2, BEQI0, and BEQI1 are all set to 0.

The unconditional jump instruction jar and unconditional jump immediate instruction jari all belong to unconditional jump instructions with similar functions in the branch/jump instructions. Taking the unconditional jump instruction as an example now, and the implementation steps thereof are provided.

Example 7: unconditional jump instruction "jar R18". Assuming that R18=0x311, the next instruction jumps to the instruction in the CMU with the address 0x311 pointed to by the address register R18.

The implementation steps are as follows:

(7.1) The instruction is fetched. Refer to the operation step for the instruction fetching in Example 2.

(7.2) After the instruction is decoded, the row selection module selects the on-chip address 0x311 according to the value of the address register R1 (which is recorded as a unit A for convenience of description), and the selected bit p thereof is set to 1.

(7.3) The address of the next instruction to be executed in the program counter is changed to the address A (0x311) in R18.

(7.4) Finally, the selected bit p of A is set to 0.

The add instruction add, the add immediate instruction addi, the add unsigned instruction addu, and the add immediate unsigned instruction addiu all belong to addition instructions with similar functions in the arithmetic operation instructions.

Taking the add instruction as an example now, and the implementation steps are provided.

Example 8: add instruction "add R6, R12, R7". Assuming that R6=0x147, R12=0x190, and R7=0x191, the data in the CMU with the address 0x190 pointed to by the source address register R12 and the data in the CMU with the address 0x191 pointed to by the source address register R7 are added as signed numbers, and the result is written into the CMU with the address 0x147 pointed to by the destination address register R6.

The implementation steps are as follows:

(8.1) The instruction is fetched. Refer to the operation step for the instruction fetching in Example 2.

(8.2) After the instruction is decoded, the row selection module selects the on-chip address 0x190 (which is recorded as a unit A1 for convenience of description), the on-chip address 0x191 (which is recorded as a unit A2 for convenience of description), the on-chip address 0x147 (which is recorded as a unit A3 for convenience of description), and the addresses of the assistive units ADD1 to ADD5 in the addition assistive block according to the values of the address register R12, R7, and R6, and the selected bits p thereof are all set to 1.

(8.3) The XOR operation is performed on the data in A1 and the data in A2, and the result is written into ADD1.

(8.4) The initial i=0, the NAND operation is performed on the $i^{th}$-bit of the data in A1 and the $i^{th}$-bit of the data in A2, and the result is written into the $i^{th}$-bit of ADD2.

(8.5) The NAND operation is performed on the $i^{th}$-bit of the data in ADD1 and the $i^{th}$-bit of the data in ADD4, and the result is written into the $i^{th}$-bit of ADD3.

(8.6) The NAND operation is performed on the $i^{th}$-bit of the data in ADD2 and the $i^{th}$-bit of the data in ADD3, and the result is written into the $i^{th}$-bit of ADD4.

When i<31, i=i+1, and Steps (8.4) to (8.6) are circulated. When i>31, the circulation ends and Step (8.7) is proceeded.

(8.7) The XOR operation is performed on the data in ADD1 and the data in ADD4, and the result is written into ADD5.

(8.8) The data in ADD5 is written into A3 through a data movement operation.

(8.9) Finally, the selected bits p of A1 to A3 and ADD1 to ADD5 are all set to 0.

The multi-processor parallel architecture of modern computers can effectively increase the operating speed. In the reduced instruction set processor based on a memristor, the multi-chip parallel architecture may also be considered. The parallelism of data computations or data operations may be fully developed on the basis that non-correlated implications may be in parallel.

Figure 7:
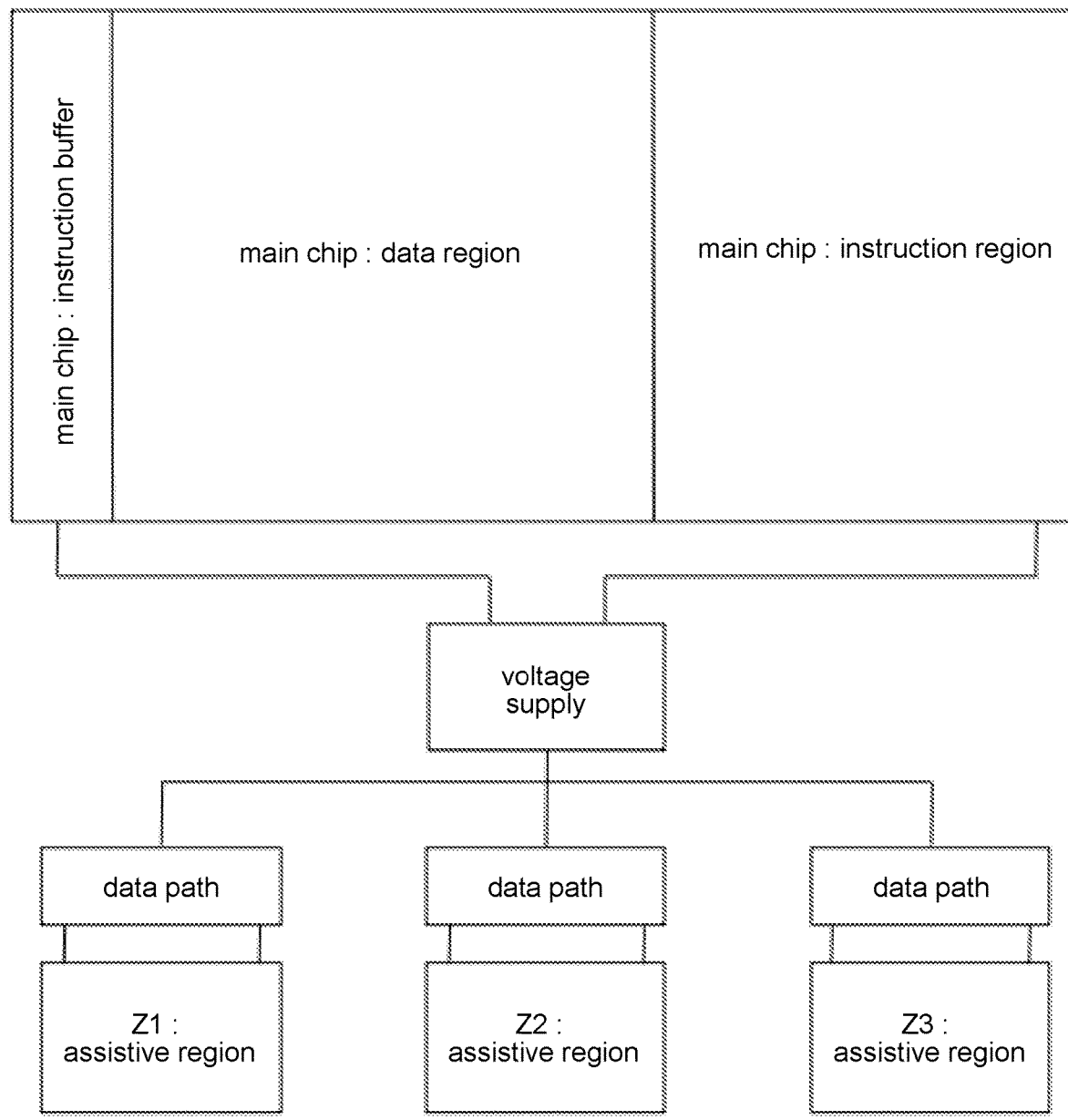
FIG. 7 is a schematic diagram of a multi-chip parallel architecture omitting most of external assistive modules.

FIG. 7 shows a multi-chip parallel architecture omitting most of external assistive modules. In the multi-chip parallel architecture, multiple COMEM chips are divided into a main chip and several computing chips according to the responsibilities thereof in the parallel architecture. The number of computing chips in the architecture shown in FIG. 7 is 3.

The internal CMU structure of the main chip and the computing chips is exactly the same as that shown in FIG. 2, but the chip scale, external modules, functions, and partitions are different from the single-chip architecture. The CMU of the main chip is divided into the instruction buffer, the data region, and the instruction region, includes all external assistive modules, is used for memory, instruction processing, and task allocation, and has a larger scale. The computing chip only contains the assistive region, which is divided into multiple assistive blocks according to Table 2 to complete different computations or operations, only includes row selection, column selection, controller and voltage supply external assistive modules, is used for computation, and has a smaller scale.

There is a data path between the main chip and the computing chip. Data is transmitted between the main chip and the computing chip through the data path. The essence of the data path is the assistive block of the data movement operation. Data transmission between the main chip and the computing chip is actually a data movement operation implemented through a two-step implication. Since non-correlated implications may be in parallel, the main chip is allowed to simultaneously transmit data of different CMUs to multiple computing chips or the same computing chip.

Under the multi-chip parallel architecture, the fetching of instruction, decoding, and address selection are still serially executed one by one. The part that may be parallelized is the transmission of data between the main chip and the computing chip through the data path, and the process of each computing chip executing a computing task.

The processing process of an instruction of the multi-chip parallel architecture is: the main chip fetches and decodes the instruction from the instruction region one by one according to the current PC value, selects the corresponding CMU according to the value of the address register in the instruction, and then allocates the data in the corresponding CMU and the control signal obtained by decoding to a certain computing chip according to the load balancing algorithm. The computing chip completes the function required by the instruction. At this time, the main chip may fetch and decode the next instruction. After completing the computing task, the computing result is returned from the computing chip to the data region of the main chip via the data path. In short, the multi-chip parallel architecture separately processes the instruction fetching, decoding, address selection, and instruction execution. The instruction fetching, decoding, and address selection are completed in the main chip, and the instruction execution is completed in the computing chip.

Example 9: under the multi-chip parallel architecture of a reduced instruction set processor based on a memristor, 1 main chip, and 2 computing chips, 2 sequentially executed addition instructions without data correlation are completed:

① 0x300: "add R1, R2, R3", and assuming that R1=0x001, R2=0x002, and R3=0x003, and ② 0x301: "add R4, R5, R6", and assuming that R1=0x004, R2=0x005, and R3=0x006, where, the addresses indicated by the address registers are all the on-chip addresses of the main chip, and 0x300 and 0x301 are respectively the on-chip addresses of the instruction region of the 2 instructions in the main chip. The steps to complete the two instructions under the multi-chip parallel architecture are as follows:

(9.1) According to the current value of the PC, the main chip fetches the instruction ① into the instruction buffer, decodes the control signal of the instruction, selects the CMU with the addresses 0x002 and 0x003, and transmits the data therein to a computing chip Z1 via the data path. The control signal is transmitted from the controller of the main chip to the controller of the computing chip Z1. The computing chip Z1 completes the addition operation required by the instruction ①. Refer to Example 8 for the specific operation steps of the addition operation.

(9.2) The main chip fetches the instruction ② into the instruction buffer according to the current value of the PC, decodes the control signal of the instruction, selects the CMU with the addresses 0x005 and 0x006, and transmits the data therein to a computing chip Z2 via the data path. The control signal is transmitted from the controller of the main chip to the controller of the computing chip Z2. The computing chip Z2 completes the addition operation required by the instruction ②. At this time, the main chip may fetch and decode other instructions.

(9.3) After Z1 and Z2 respectively complete the addition operations required by the instruction ① and the instruction ②, the results of the addition operations may be returned (in parallel) to the computing and memory units with the corresponding addresses 0x001 and 0x004 of the main chip via the data path.

Persons skilled in the art can easily understand that the above are only preferred embodiments of the disclosure and are not intended to limit the disclosure. Any modification, equivalent replacement, improvement, etc. made within the spirit and principle of the disclosure should be included in the protection scope of the disclosure.

Therefore, there is no large power consumption and time spending caused by the continuous movement of data between the memory and the processor, so as to effectively achieve the beneficial effects of saving power consumption and shortening processing time.

What is claimed is:

1. A reduced instruction set processor based on a memristor, characterized by comprising: a computing and memory chip based on a memristor, comprising: N computing and memory units, wherein each computing and memory unit serves as a row of the chip and corresponds to an on-chip address;

each computing and memory unit comprises M memristive units, marking units, and connection switches; each memristive unit comprises a bit line switch and a memristor connected in series; any two of the N computing and memory units may be connected through the connection switch located on a word line;

the M memristive units, marking units, and connection switches in each row are connected in series through the word line; one end of the word line is configured to connect a row selection module, and the other end is configured to connect a voltage supply module;

memristive units representing the same bit in all the computing and memory units are connected in series through a bit line; one end of the bit line is grounded, and the other end is configured to connect a column selection module; and M is a positive integer greater than or equal to 8.

2. The reduced instruction set processor according to claim 1, wherein the N computing and memory units in the computing and memory chip are divided into 4 regions, an instruction buffer region, a data region, an assistive region, and an instruction region, according to functions;

the instruction buffer region is configured to buffer an instruction to be decoded and executed;

the data region is configured to store all related data;

the assistive region is configured to buffer an intermediate result generated due to a multi-step implication during a computing process;

the instruction region is configured to store all instructions to be executed;

the instruction buffer region has a total of 1 computing and memory unit, the data region has a total of P computing and memory units, the assistive region has a total of Q computing and memory units, and the instruction region has a total of R computing and memory units; and values of P, Q, and R are set according to actual requirements, but a quantitative relationship of N=P+Q+R+1 must be satisfied.

3. The reduced instruction set processor according to claim 1, that wherein the marking unit comprises an X-bit of complementary metal-oxide-semiconductor (CMOS) transistor, the X-bit of comprises a selected bit p, 2 bits of voltage determination bit v1 and v2, and X-3 bits of connection bit c1, c2, ..., cX-3, the selected bit p is configured to mark a computing and memory unit selected by the row selection module;

the 2 bits of voltage determination bit v1 and v2 are configured to mark a type of voltage that should be applied to the computing and memory unit, and are only valid when the selected bit p=1; and the X-3 bits of connection bit c1, c2, ..., cX-3 are configured to mark whether a certain computing and memory unit is connected with other computing and memory units for implication, and are only valid when the selected bit p=1.

4. The reduced instruction set processor according to claim 3, wherein the voltage supply module comprises a selected sensing unit and 3 voltage pulse generators;

the selected sensing unit is configured to search for all computing and memory units in the chip whose selected bit p is set to 1 and obtain values of the voltage determination bit v1 and v2 in the marking unit thereof; and the 3 voltage pulse generators $V_{CLEAR}$, $V_{COND}$, and $V_{SET}$ are configured to apply one of voltage pulses $V_{CLEAR}$, $V_{COND}$, and $V_{SET}$ to the computing and memory unit; and the voltage pulse generator determines which voltage pulse should be applied to which computing and memory unit according to the selected bit p obtained by the selected sensing unit and the values of the voltage determination bits v1 and v2.

5. The reduced instruction set processor according to claim 1, wherein the reduced instruction set processor fluffier comprises:

a program counter PC, configured to record an on-chip address of a next instruction to be executed;

an address register set, having a total of 32 address registers sequentially numbered as R0 to R31, configured to buffer on-chip addresses of some of the computing and memory units, and serving as an operand field in an instruction, and a bit number of each address register is $\log_2 N$; wherein a value of R0 is always 0 without buffering any on-chip address;

a row selection module, for selecting a computing and memory unit of a corresponding address in the chip according to a value of the PC or the address register for subsequent data computation or data operation, wherein after the row selection module selects a computing and memory unit, a selected bit p of the computing and memory unit is set to 1;

a column selection module, for turning on bit line switches of some or all of memristive units of the computing and memory unit selected by the row selection module according to a data bit number of an operation specifically required by the instruction to control which memristive units of the computing and memory unit will participate in the computation; and an instruction decoder and controller, configured to decode and analyze the instruction in the instruction buffer, and provide a corresponding control signal according to a decoding result to complete execution of the instruction.

6. The reduced instruction set processor according to claim 1, wherein the reduced instruction set processor further comprises instruction modules, comprising: a basic integer instruction module, a single-precision floating point instruction module, and a double-precision floating point instruction module; wherein each instruction module is implemented on one or more chips, and a corresponding chip is selected to run according to requirements, so as to satisfy different application scenarios.

7. The reduced instruction set processor according to claim 6, wherein a word length of the processor is M bits, a length of the instruction is M bits, and types of the instruction comprise a data operation instruction, a logic operation instruction, an arithmetic operation instruction, and a branch/jump instruction;

the data operation instruction comprises a null instruction, a move instruction, an move immediate instruction, a shift left logical instruction, a shift left logical immediate instruction, a shift right logical instruction, a shift right logical immediate instruction, a shift right arithmetic instruction, a shift right arithmetic immediate instruction, a sign extension instruction, a sign extension immediate instruction, a zero extension instruction, and a zero extension immediate instruction;

the logic operation instruction comprises an AND instruction, an immediate AND instruction, an OR instruction, an OR immediate instruction, a NOT instruction, a NOT immediate instruction, an XOR instruction, an XOR immediate instruction, a NAND instruction, and a NAND immediate instruction;

the arithmetic operation instruction comprises an add instruction, an add unsigned instruction, an add immediate instruction, and an add immediate unsigned instruction; and the branch/jump instruction comprises an unconditional jump instruction, an unconditional jump immediate instruction, a branch if equal instruction, a branch if equal immediate instruction, a branch if not equal instruction, and a branch if not equal immediate instruction.

8. The reduced instruction set processor according to claim 6, wherein highest 2 bits of the instruction of the processor are extended sign bits, the extended sign comprises "00", "01", and "10";

the extended sign "00" represents an R-type instruction, and a source operand and a destination operand are both address registers;

the extended sign "01" represents an I-type instruction, a source operand is an immediate and an address register, and a destination operand is an address register; and the extended sign "10" represents a J-type instruction, and are all branch target addresses except for the extended sign and an operation code, the extended sign also comprises "11", which represents an illegal instruction.

9. A multi-chip parallel architecture processor based on a memristor, comprising: a main chip and a total of Z computing chips; wherein internal structures of chips of the main chip and the computing chip are exactly the same as an internal structure of the chip according to claim 1, except for functions and chip partitions; the main chip is used for memory, instruction processing, and task allocation, and is divided into a data region, an instruction region, and an instruction buffer; and the computing chip is used for computation and the computing chip only includes an assistive region;

there is a data path existed between the main chip and the computing chip, and data is transmitted between the main chip and the computing chip through the data path; and under a multi-chip parallel architecture, instruction fetching, decoding, and address selection are serially executed one by one, the data is transmitted between the main chip and the computing chip through the data path, a process of each computing chip executing a computing task may be performed in parallel, so the multi-chip parallel architecture can effectively improve an instruction processing speed.

* * * * *